(12) United States Patent
Marando et al.

(10) Patent No.: US 8,662,858 B2
(45) Date of Patent: *Mar. 4, 2014

(54) GENERATING A PWM SIGNAL DEPENDENT ON A DUTY CYCLE HAVING A PIECEWISE LINEAR RELATIONSHIP WITH TEMPERATURE

(75) Inventors: Eileen M. Marando, Bellmore, NY (US); Robert W. Schoepflin, Port Jefferson, NY (US)

(73) Assignee: Standard Microsystems Corporation, Hauppauge, NY (US)

( * ) Notice: Subject to any disclaimer, the term of this patent is extended or adjusted under 35 U.S.C. 154(b) by 1589 days.

This patent is subject to a terminal disclaimer.

(21) Appl. No.: 11/395,004

(22) Filed: Mar. 31, 2006

(65) Prior Publication Data

US 2006/0193729 A1   Aug. 31, 2006

Related U.S. Application Data

(63) Continuation of application No. 10/440,745, filed on May 19, 2003, now Pat. No. 7,029,239.

(51) Int. Cl.
*F04B 49/06* (2006.01)
*F04B 49/10* (2006.01)

(52) U.S. Cl.
USPC .......................................... 417/44.1; 417/32

(58) Field of Classification Search
USPC .......... 417/44.1, 292, 44.11, 18, 45; 318/811; 700/299
See application file for complete search history.

(56) References Cited

U.S. PATENT DOCUMENTS

| | | | | |
|---|---|---|---|---|
| 4,727,468 A * | 2/1988 | Maekawa | .......................... | 363/41 |
| 4,933,535 A * | 6/1990 | Zabinski | ....................... | 219/497 |
| 5,307,439 A * | 4/1994 | Enami | ............................ | 388/811 |
| 5,727,928 A * | 3/1998 | Brown | ....................... | 417/44.11 |
| 5,825,972 A * | 10/1998 | Brown | ........................ | 388/811 |
| 5,942,866 A * | 8/1999 | Hsieh | ............................ | 318/268 |
| 6,051,952 A * | 4/2000 | Moreira et al. | ................ | 318/738 |
| 6,188,189 B1 * | 2/2001 | Blake | ............................ | 318/471 |
| 6,208,538 B1 * | 3/2001 | Halamik et al. | ................ | 363/41 |
| 6,226,324 B1 * | 5/2001 | Allstrom | ........................ | 375/238 |
| 6,519,167 B1 * | 2/2003 | Nguyen | ........................... | 363/41 |
| 6,528,987 B1 * | 3/2003 | Blake et al. | .................... | 324/168 |
| 6,661,679 B1 * | 12/2003 | Yang et al. | ....................... | 363/41 |
| 6,735,499 B2 * | 5/2004 | Ohki et al. | ...................... | 700/299 |
| 6,757,592 B1 * | 6/2004 | Henderson et al. | ........... | 700/299 |
| 7,075,261 B2 * | 7/2006 | Burstein | ................... | 318/400.11 |
| 2006/0193729 A1 * | 8/2006 | Marando et al. | .............. | 417/44.1 |

OTHER PUBLICATIONS

Analog Devices, Publication ADM1027, "*dBCOOL*™ Remote Thermal Controller and Voltage Monitor," 2003, 56 pages.

(Continued)

*Primary Examiner* — Devon C Kramer
*Assistant Examiner* — Alexander Comley
(74) *Attorney, Agent, or Firm* — King & Spalding L.L.P.

(57) ABSTRACT

A system may include a PWM generator and control logic. The PWM generator is configured to generate a PWM signal having a duty cycle dependent on a duty cycle value generated by the control logic. The control logic is configured to generate the duty cycle value to have a piecewise linear relationship with temperature such that at least two of a plurality of linear segments defined by the piecewise linear relationship have different slopes. In some embodiments, the piecewise linear relationship may be continuous.

24 Claims, 4 Drawing Sheets

(56) References Cited

OTHER PUBLICATIONS

National Semiconductor Corporation, Publication LM63, "±1° C Accurate Remote Diode Digital Temperature Sensor with Integrated Fan Control," Feb. 2003, 28 pages.

Stephen Ohr, "Analog IC vendors find 'Intel Inside' a safe bet," Sep. 12, 2002, online at http://www.eetimes.com/story/OEG20020912S0026, 5 pages.

* cited by examiner

GENERATING A PWM SIGNAL DEPENDENT ON A DUTY CYCLE HAVING A PIECEWISE LINEAR RELATIONSHIP WITH TEMPERATURE

CONTINUATION DATA

This application is a continuation of application Ser. No. 10/440,745 titled "Piecewise Linear Control of the Duty Cycle of a Pulse Width Modulated Signal" filed on May 19, 2003 now U.S. Pat. No. 7,029,239 whose inventors are Eileen M. Marando and Robert W. Schoepflin, which is hereby incorporated by reference as though fully and completely set forth herein.

BACKGROUND OF THE INVENTION

1. Field of the Invention

This invention relates to pulse width modulation (PWM) and, more particularly, to controlling the duty cycle of a pulse width modulated signal used to power a fan.

2. Description of the Related Art

Fans are often used to evacuate warm air from enclosures in which electronic systems are contained. For example, most computer systems include at least one fan to aid in system cooling. The increased airflow provided by fans aids in eliminating waste heat that may otherwise build up and adversely affect system operation.

Control of fans in a system typically involves a fan control unit executing a fan control algorithm. A fan control algorithm may determine the method for controlling one or more fans that are configured to evacuate warm air from a system enclosure. For example, the fan control algorithm may specify that a fan's speed should be increased or decreased dependent upon a detected temperature. Such control algorithms may also involve turning off a fan if the temperature is deemed cool enough to do so.

Fan drive systems often use a PWM generator to drive an external circuit that controls the voltage between the power and ground interfaces of the fan, which in turn controls the speed of the fan. PWMs are useful because they provide a digital control for the pulse width of a signal. The fan is turned on for the duration of the pulse and turned off between pulses. The duty cycle of the pulse train currently being provided to the fan determines the fan's speed.

One problem that results from using PWMs to drive fan circuits is that the fan noise increases when the duty cycle of the PWM is changed. Typically, linear algorithms are used to control how the duty cycle of the PWM changes in response to increases in temperature. Thus, the duty cycle of the PWM will undergo the same amount of change per degree of temperature change, regardless of how the temperature relates to the allowable range of temperatures.

SUMMARY

Various embodiments of a method and apparatus for providing piecewise linear control of the duty cycle of a pulse width modulator (PWM) are disclosed. In one embodiment, a system may include a PWM generator and control logic. The PWM generator is configured to generate a PWM signal having a duty cycle dependent on a duty cycle value generated by the control logic. The control logic is configured to generate the duty cycle value to have a piecewise linear relationship with temperature such that at least two of a plurality of linear segments defined by the piecewise linear relationship have different slopes. In some embodiments, the piecewise linear relationship may be continuous.

In one embodiment, the control logic may be configured to store a minimum temperature value and a value indicating a temperature range. The control logic is configured to assign each of a plurality of portions of the temperature range to a respective one of the plurality of linear segments. The assigned portions of the temperature range may be equally or unequally sized, depending on the embodiment.

The piecewise linear relationship may defined by a plurality of linear equations. Each of the linear equations may be associated with a particular portion of the temperature range. The control logic may be configured to receive a temperature value representing a current temperature and to select one of the linear equations that is associated with the portion of the temperature range that includes the temperature value. The control logic may then process the temperature value according to the selected linear equation to generate the duty cycle value. The linear equations may approximate a parabola in some embodiments.

In some embodiments, the slope of one of the linear equations associated with a lower portion of the temperature range may be less than the slope of another one of the linear equations associated with a higher portion of the temperature range.

In one embodiment, the control logic may be configured to store a value indicating a PWM duty cycle range for each of the linear equations. The control logic may be programmable to update the value indicating the PWM duty cycle range for each of the plurality of linear equations. The control logic may also be configured to store and/or update a value indicating a temperature range for each of the plurality of linear equations.

In one embodiment, the control logic may be configured to selectively generate the duty cycle to have a piecewise linear relationship with temperature or to have a linear relationship with temperature dependent on the value of a programmable mode register included in the control logic.

A method may involve powering a fan according to a PWM (pulse width modulated) signal and generating a duty cycle of the PWM signal to have a piecewise linear relationship with temperature.

BRIEF DESCRIPTION OF THE DRAWINGS

Other aspects of the invention will become apparent upon reading the following detailed description and upon reference to the accompanying drawings in which.

Figure 1:
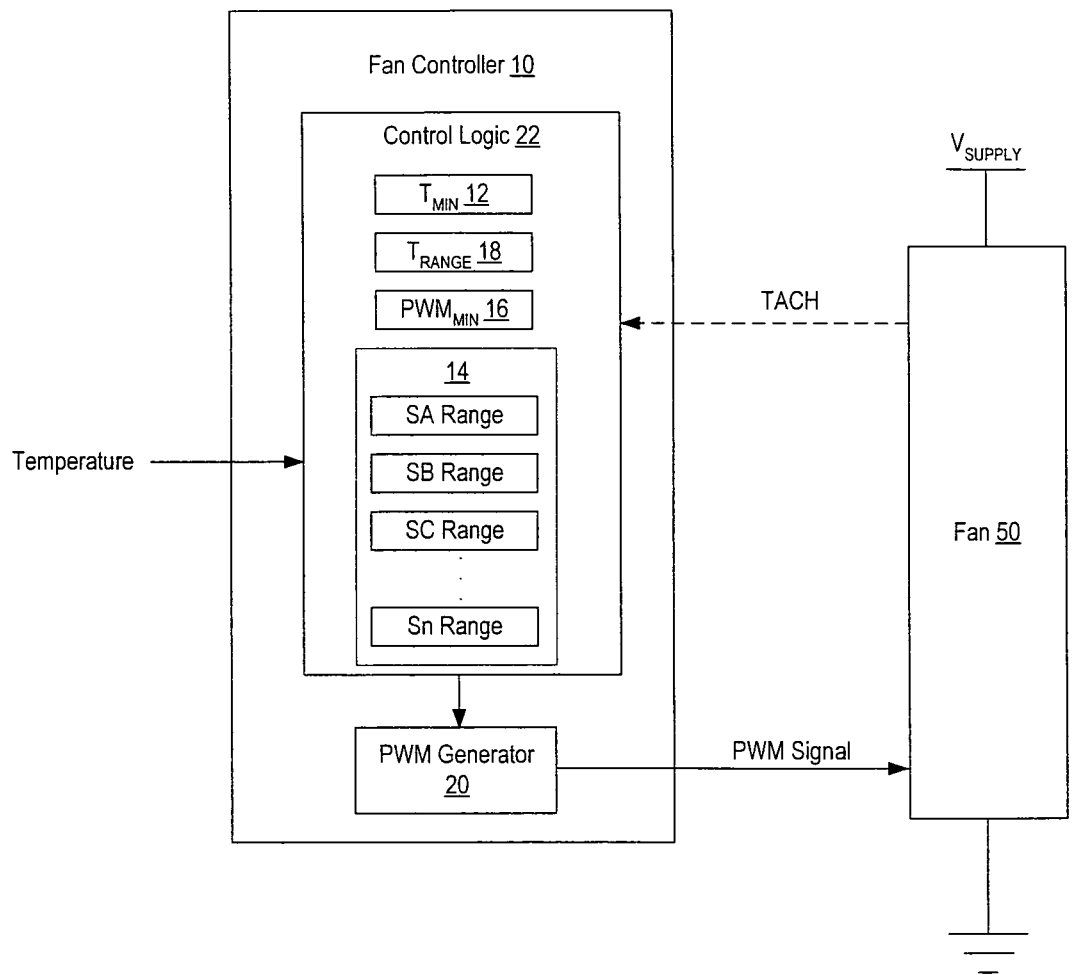
FIG. 1 is a block diagram of a system for controlling a fan, according to one embodiment.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF EMBODIMENTS

FIG. 1 shows an embodiment of a system for powering a fan with a PWM (Pulse Width Modulated) signal. This system includes a controller 10 and a fan 50. A PWM signal generated by fan controller 10 controls whether the fan 50 is turned on or not. This system may be included in an enclosure containing various electronic devices. For example, this system may be included in a desktop computer chassis or a storage array enclosure.

The fan controller 10 includes control logic 22 and a PWM (Pulse Width Modulator) generator 20 configured to generate the PWM signal. The control logic 22 is configured to provide a value indicative of the duty cycle to the PWM generator 20, and the PWM generator 20 is configured to responsively generate the PWM signal having that duty cycle. PWM generator 20 is an example of a means for powering a fan 50 according to a PWM signal having a duty cycle dependent on a duty cycle value. Control logic 22 is an example of a means for generating a duty cycle value having a piecewise linear relationship with temperature. As used herein, a piecewise linear relationship is a mathematical relationship defining several linear segments, at least two of which have different slopes. A piecewise linear relationship may be continuous or discontinuous.

The fan 50 may have two ports (power and ground) or three ports (power, ground, and tachometer) in some embodiments. In some embodiments in which the fan 50 has three ports, the fan controller 10 may generate the PWM signal dependent on the fan tachometer signal.

In some embodiments, the PWM signal may be input to fan drive circuitry (not shown) such as a switch. For example, fan drive circuitry may include a switch coupled between the ground input of the fan 50 and ground. When the PWM signal is high, the switch may close, connecting the ground interface of the fan 50 to ground. When the PWM is low, the switch may open, creating an open circuit between the ground interface of the fan 50 and ground. Accordingly, opening the switch by deasserting the PWM signal turns off the power to the fan 50. Note that the PWM signal may be an active high or an active low signal. For example, if the switch is implemented using a PNP transistor, switch may close when the PWM signal is low. In such an embodiment, the switch may be coupled to the power interface of the fan 50 (as opposed to the ground interface) between the power interface and the power source. When the switch is closed, the power interface of the fan 50 is connected to the power source, turning on the fan 50. Note that other embodiments may include different fan drive circuitry or no fan drive circuitry at all (e.g., the PWM signal may be input directly to one of the fan's input terminals).

As the duty cycle (the ratio of the time in which the PWM signal is asserted to the time in which the PWM signal is deasserted) of the PWM signal increases, the fan is powered for a greater percentage of time each cycle. Consequentially, the fan speed increases. Similarly, as the duty cycle decreases, the fan speed decreases. Thus, fan controller 10 may control the speed of the fan 50 by varying the duty cycle of the PWM signal.

Fan controller 10 may receive an indication of the current temperature (e.g., by detecting the current temperature itself or by receiving a digital or analog signal representing the temperature detected by another device) and control the fan speed dependent on the current temperature. As the temperature increases, the fan controller 10 may increase the fan speed in order to provide increased cooling. If the temperature decreases, the fan controller 10 may decrease the fan speed. If the temperature stabilizes, the fan controller 10 may keep the fan speed the same. Note that in many embodiments, the fan controller 10 may vary the duty cycle of the PWM signal according to other parameters in addition to the current temperature. For example, in some embodiments, the fan controller 10 may detect both the current temperature and the rate of temperature change experienced in the most recent period. In such embodiments, the fan controller may be configured to selectively vary the duty cycle of the PWM signal less at higher values of the temperature if the temperature is stabilizing than if the temperature is increasing. Other parameters may also affect how the fan controller 10 modifies the duty cycle of the PWM signal.

The fan controller 10 may be configured to generate the PWM signal such that a duty cycle of the PWM signal has a piecewise linear relationship with temperature. The piecewise linear relationship may be defined by several linear equations. When a temperature value is input into the fan controller 10, the control logic 22 may select one of the linear equations and process the temperature value using the selected linear equation to produce a PWM duty cycle value. The fan controller 10 may generate the duty cycle of the PWM signal dependent on the duty cycle value produced using the selected linear equation.

In some embodiments, the piecewise linear relationship may be continuous. To define such a piecewise linear relationship, the control logic 22 may include several registers 12, 18, and 16 that respectively store values indicating the minimum temperature ($T_{MIN}$) at which the piecewise linear relationship begins, the temperature range ($T_{RANGE}$) over which the piecewise linear relationship extends, and the minimum PWM duty cycle ($PWM_{MIN}$) to be generated. The minimum temperature $T_{MIN}$ is the temperature at which the fan controller 10 is configured to turn on the fan 50. The minimum PWM duty cycle value $PWM_{MIN}$ is the PWM duty cycle value that will turn on the fan at a desired minimum speed. In one embodiment, values of temperature may range from −127° C. to +127° C. (note that the fan controller 10 may only respond to a limited range of these values, however). Note that different embodiments may provide different temperature resolutions (e.g., fractional portions of degrees may be specified) and/or ranges.

The control logic 22 may also include several registers 14 that further control each of the n linear equations that define the continuous piecewise linear relationship. Each register 14 stores a segment (S) range for one of n segments SA-Sn that each defines the range of duty cycle values generated by a respective one of the linear equations. The segment registers may be programmed so that the combined linear equations generate duty cycle values over 100% of the range of PWM duty cycle values from $PWM_{MIN}$ to $PWM_{MAX}$. Each linear equation may begin generating values in a PWM duty cycle range that begins immediately after the range of PWM duty cycle values generated by a previous equation.

Note that the registers shown in FIG. 1 are exemplary and that other register values may be used in other embodiments instead of and/or in addition to the illustrated register values. For example, in an alternative embodiment, control logic 22 may include registers that store a minimum and maximum temperature value but may not include a register that stores a temperature range. Similarly, in one embodiment, the control logic 22 may be configured to selectively generate the duty cycle to have a piecewise linear relationship with temperature or to have a linear relationship with temperature dependent on the value of a programmable mode register included in the control logic 22.

In one embodiment, registers 12-18 may be programmed to store 8-bit values (other embodiments may implement different numbers of bits). The control logic 22 may be configured to update the values in these registers 12-18 in response to receiving new values in some embodiments. For example, if the operating parameters of the system in which fan controller 10 is included change (e.g., if the system is modified or moved to a different operating environment), a user may recompute new values to store in one or more of the registers 12-18 and reprogram the fan controller 10 with these new values.

The control logic 22 may use the values in registers 12, 14, 16, and 18 to determine each of the linear equations that define the piecewise linear relationship. In the illustrated embodiment, the control logic 22 may associate a portion of the temperature range with each of the linear equations. For example, if the control logic 22 supports up to five linear equations to define a piecewise linear relationship and the temperature range is 20 degrees Celsius, the control logic 22 may associate a four-degree range with each linear equation. Thus, when the input temperature is within the first four degrees of the temperature range, the control logic 22 may process the input temperature according to the first linear equation. When the input temperature is within the next four degrees of the temperature range, the control logic 22 may process the input temperature according to the second linear equation, and so on. Note that in some embodiments, the control logic 22 may not divide the temperature range equally when associating portions of the temperature range with each linear equation. For example, the control logic 22 may assign a six-degree range to the first linear equation, a five-degree range to the next linear equation, and so on.

In some embodiments, there may be a minimum temperature range (e.g., one degree Celsius) that may be assigned to each linear equation. The control logic 22 may vary the number of linear equations that define the piecewise linear relationship from the default number of linear equations dependent on the selected temperature range and the minimum temperature range per linear equation. If the total temperature range is less than the product of the default number of linear equations and the minimum temperature range, the control logic 22 may be configured to use fewer than the default number of linear equations so as to be able to assign the minimum temperature range to each linear equation that is used. For example, if the minimum temperature range per linear equation is one degree Celsius, the default number of linear equations is five, and the programmed temperature range is three degrees Celsuis, the control logic 22 may reduce the number of linear equations to use to define the piecewise linear relationship to three linear equations.

The segment ranges (stored in registers 14) associated with each linear equation may, in conjunction with the temperature range associated with each linear equation, define the slope of each linear equation.

The various linear equations that define the piecewise linear relationship may be programmed (e.g., using registers 12-18) to approximate various curves. For example, in one embodiment, the linear equations may be programmed to approximate a parabola such that the first linear equation has a smaller slope than later linear equations. In other embodiments, other curves may be approximated. In some embodiments, the slopes of the various linear segments making up the piecewise linear relationship may have higher slopes in higher temperature ranges (e.g., each linear segment may have a higher slope than the linear segment in the next-lowest temperature range). In other embodiments, successive linear segments may have decreasing slopes, or both increasing and decreasing slopes.

In many embodiments, less acoustic noise may be generated for smaller changes in fan speed than for larger changes in fan speed. In some embodiments, the linear equations defining the piecewise linear relationship may be programmed such that less change in fan speed occurs per degree temperature change at lower temperatures than at higher temperatures. By controlling the duty cycle to have such a piecewise linear relationship with temperature, the amount of change in fan speed may be reduced at lower temperatures, causing a reduction in the amount of acoustic noise at lower temperatures relative to the amount of acoustic noise generated at higher temperatures.

Figure 2:
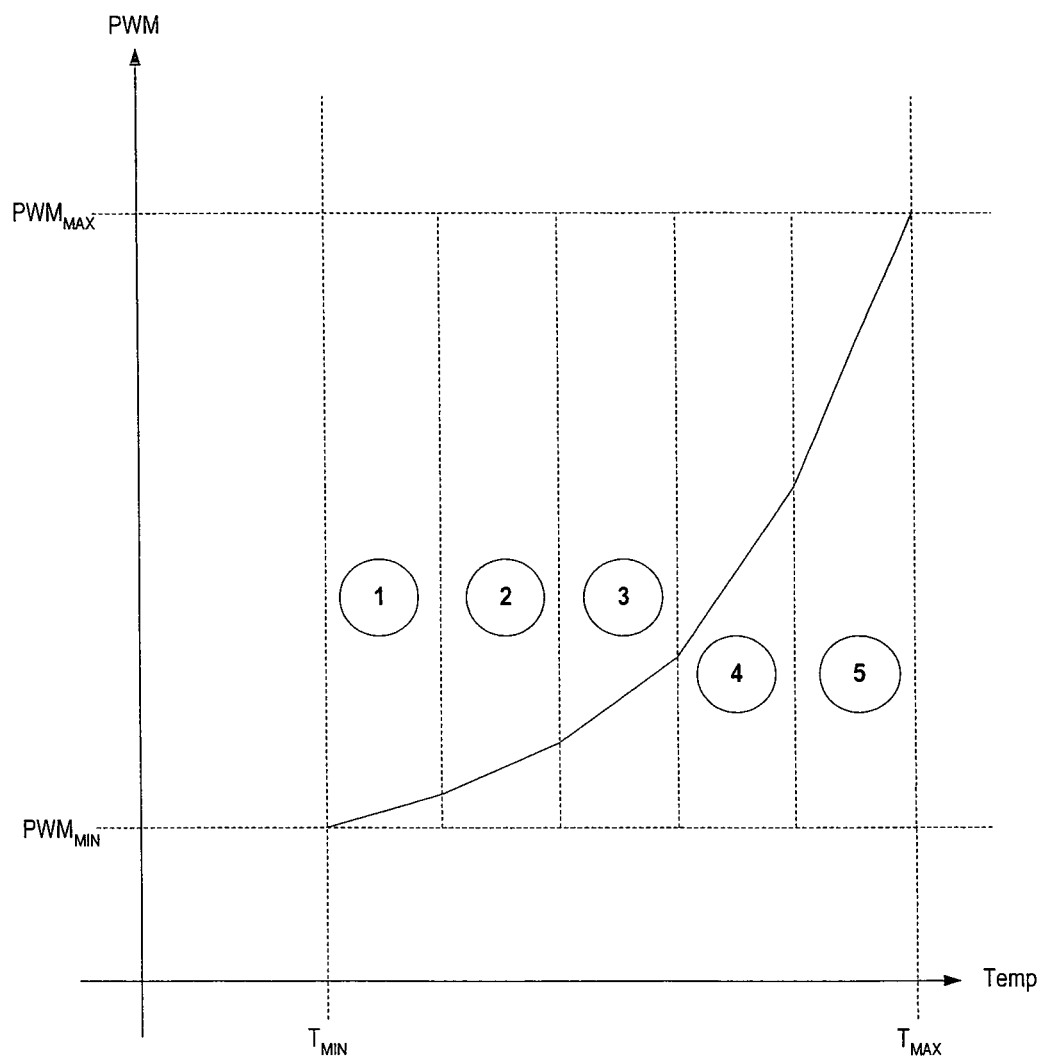
FIG. 2 shows the piecewise linear relationship between temperature and PWM duty cycle of a PWM signal generated by a fan controller, according to one embodiment.

FIG. 2 illustrates a plot of a piecewise linear PWM verses temperature relationship that may be implemented by control logic 22 in one embodiment. The x-axis represents temperature and the y-axis represents duty cycle values. In these embodiments, the duty cycle is controlled by an eight-bit duty cycle value, which ranges from 0 (0% duty cycle) to 255 (FFh) (100% duty cycle). In such an embodiment, the percentage duty cycle may equal the duty cycle value multiplied by 0.39 (e.g., a 50% duty cycle=128*0.39). Note that other embodiments may implement N-bit duty cycle values, where N has a value other than eight.

As described above, the control logic 22 may calculate an appropriate duty cycle value to control the duty cycle of the PWM signal using several linear equations. In the embodiment of FIG. 2, five linear equations are used to define a continuous piecewise linear relationship between PWM duty cycle and temperature. The output of each linear equation is plotted in a respective one of the five illustrated segments. As shown, the PWM duty cycle has a continuous relationship with temperature. The PWM duty cycle value ranges from $PWM_{MIN}$ to $PWM_{MAX}$ and the temperature ranges from $T_{MIN}$ to $T_{MAX}$. In the illustrated embodiment, the temperature range is divided equally among the five linear segments. The earlier segments (e.g., segments 1-3) generate a smaller range of PWM duty cycle values than the latter segments (e.g., segments 4-5). Note that other embodiments may implement different numbers of segments.

As mentioned above, in order to generate points on the continuous linear segments shown in FIG. 2, the fan controller may calculate the PWM duty cycle value from the current measured temperature using the various linear equations that define the piecewise linear relationship. The control logic 22 may calculate the PWM duty cycle value in hardware or in software. In some embodiments, the fan controller 10 may be configured to not lose significant bits throughout the calculation process in order to maintain a desired level of accuracy. Note that the control logic 22 calculates PWM duty cycle values as a function of temperature (as opposed to simply retrieving PWM duty cycle values from a lookup table). Thus, the control logic 22 may generate a new duty cycle value for each input temperature value across the entire spectrum of potential input temperature values $T_{MAX}$>Temp>$T_{MIN}$. Note that this functionality may be somewhat dependent on the precision at which the temperature value and PWM duty cycle value can be represented within the fan controller 10.

Figure 3:
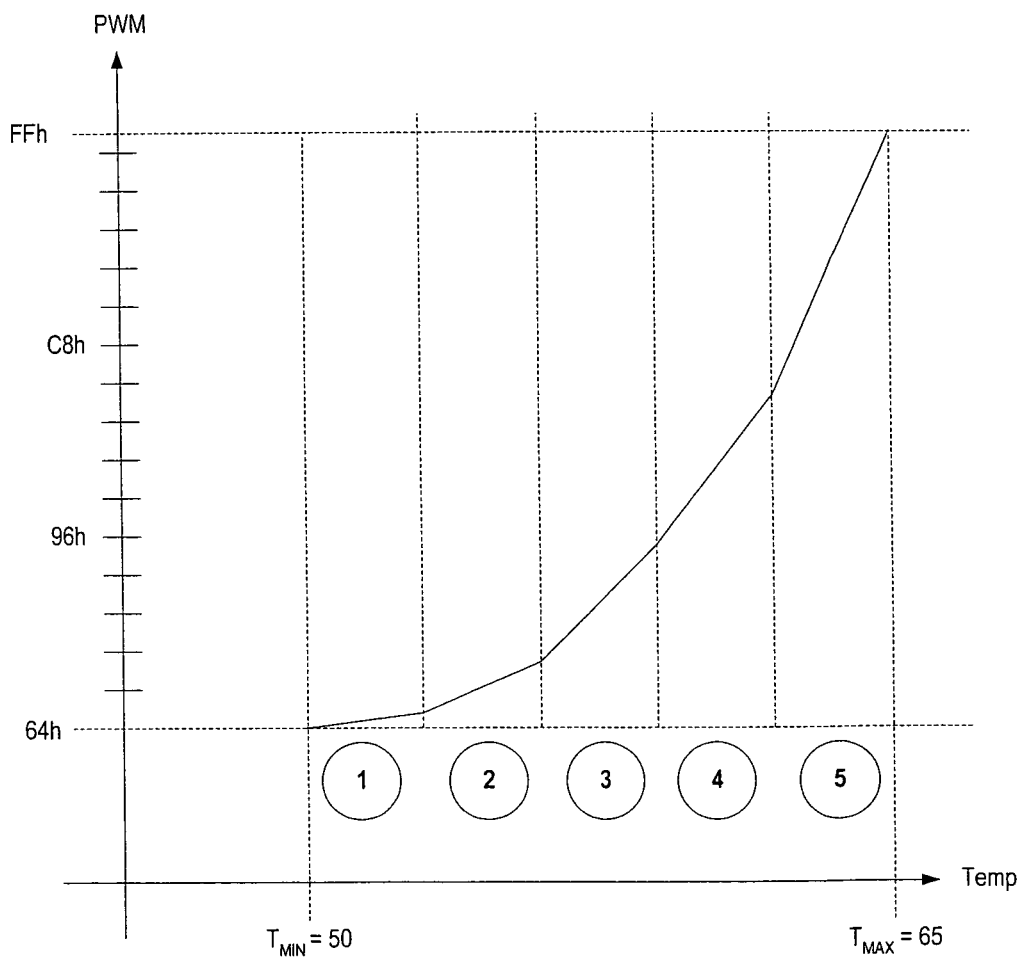
FIG. 3 shows exemplary PWM duty cycle values and a plot of the relationship between the exemplary PWM duty cycle values and temperature, according to one embodiment.

FIG. 3 illustrates a specific example of values that may be programmed into control logic 22, according to one embodiment. In FIG. 3, control logic 22 is programmed with $T_{MIN}$=50 degrees Celsuis, $T_{MAX}$=65 degrees Celsuis, and $PWM_{MIN}$=64 h (=100=39% duty cycle). In this embodiment, control logic 22 is configured to always generate $PWM_{MAX}$=FFh (=255=100% duty cycle). Five linear equations are implemented to define a continuous piecewise linear relationship. Control logic 22 is configured to divide the temperature range of 15 degrees Celsius equally among the linear equations, so each linear equation is used to calculate duty cycle values over a three-degree range of input temperature. Specifically, the first equation (used to generate linear segment 1 in the accompanying plot of PWM duty cycle value versus temperature) is assigned the temperature range 50<=t<53 degrees Celsius. Equations 2-5 are respectively assigned the ranges: 53<t<=56; 56<t<=59; 59<=t<62; and 62<=t<65. Note that in alternative embodiments, unequally-sized temperature ranges may be assigned to linear equations. Additionally, in some embodiments, temperature ranges may be assigned in other ways. For example, the temperature range for each linear equation may be explicitly programmed (e.g., by updating register(s) storing a minimum and/or maximum temperature for each linear equation or by updating a register storing a temperature range for each linear equation).

Each linear equation is also assigned a PWM duty cycle value range (e.g., by programming segment registers 14 as shown in FIG. 1). Here, the first equation is assigned a PWM duty cycle range of 04 h (=4=3% of the 64 h to FFh range). Thus, since the minimum PWM duty cycle value is 64 h (=100=39% duty cycle), the first linear equation generates PWM duty cycle values within the range 64 h to 68 h (=104=41% duty cycle). Similarly, the second linear equation generates PWM duty cycle values over a 0 Ch (=12=8%) range from 68 h to 74 h (=116=45% duty cycle). The third linear equation generates PWM duty cycle values over a 17 h (=23=15%) range from 74 h to 80 h (=128=50% duty cycle). The fourth linear equation generates PWM duty cycle values over a 27 h (=39=25%) range from 80 h to A7 h (=167=65% duty cycle). The fifth linear equation generates PWM duty cycle values over a 4 Dh (=77=50%) range from A7 h to FFh (=255=100% duty cycle). A plot of the linear segments 1-5 generated by each linear equation is also shown in FIG. 3.

Figure 4:
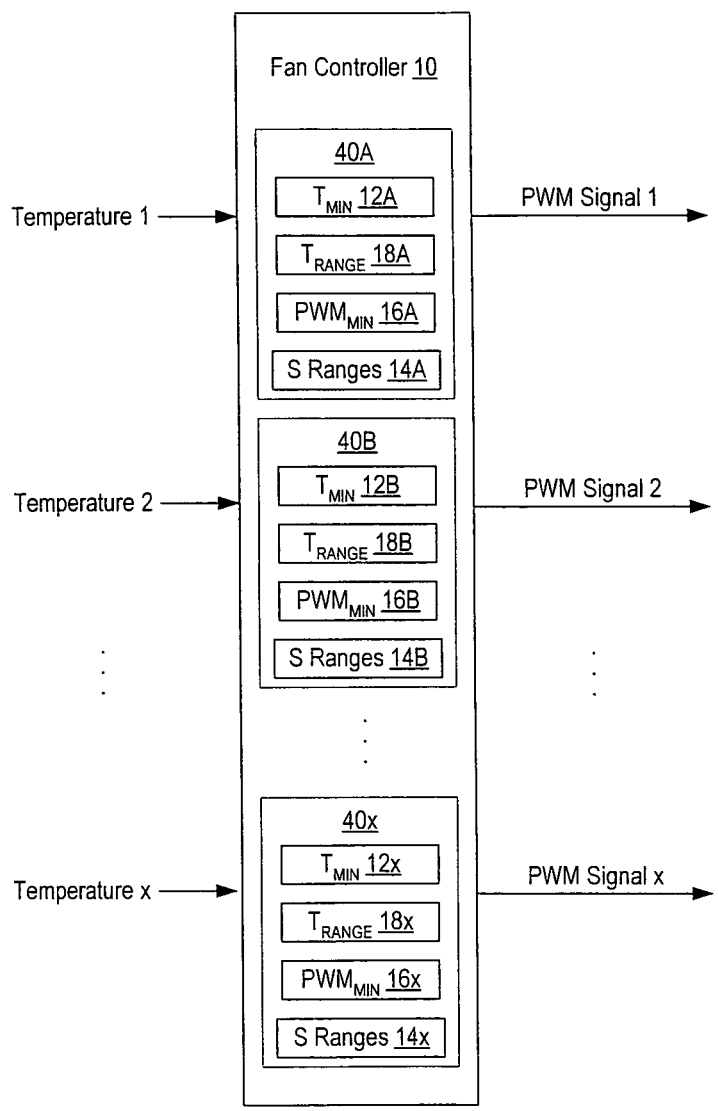
FIG. 4 shows a fan controller, according to one embodiment.

FIG. 4 illustrates a fan controller 10, according to another embodiment. In this embodiment, the fan controller 10 is configured to generate x PWM signals. Each PWM signal may be generated to have a duty cycle dependent on a respective one of x temperature inputs. Alternatively, all or some of the PWM signals may be generated in response to the same temperature input. Each PWM signal may be generated to have a different piecewise linear relationship with a respective temperature. Accordingly, the fan controller 10 may include several sets 40A-40x of registers 12-18. Set 40A includes registers 12A, 18A, 16A, and several segment range registers 14A. The other sets 40B-40x include similar registers. Each set 40 may be programmed with different values to implement a different piecewise linear relationship.

Note that at least a portion of the system shown in FIGS. 1 and 4 may be implemented as an integrated circuit. For example, in one embodiment, the fan controller 10 may be implemented as an integrated circuit. Other system functionality (e.g., bus bridge or system controller functions) may also be included in such an integrated circuit in some embodiments.

Numerous variations and modifications will become apparent to those skilled in the art once the above disclosure is fully appreciated. It is intended that the following claims be interpreted to embrace all such variations and modifications.

What is claimed is:
1. A system, comprising:
a PWM generator configured to generate a PWM (Pulse Width Modulated) signal having a duty cycle dependent on a duty cycle value; and
control logic coupled to the PWM generator and configured to generate the duty cycle value to have a piecewise linear relationship with respect to temperature, wherein the piecewise linear relationship is defined by a plurality of linear equations, wherein at least two of the plurality of linear equations defining the piecewise linear relationship have different slopes;
wherein the control logic is further configured to vary the number of the linear equations comprised in the plurality of linear equations from a default number of linear equations, according to the value of a specific overall temperature range and a minimum temperature range per linear equation.

2. The system of claim 1, wherein the control logic is further configured to store a minimum temperature value and the value of the specific overall temperature range, and wherein the control logic is further configured to assign each of a plurality of portions of the specific overall temperature range to a respective one of the plurality of linear equations.

3. The system of claim 2, wherein the control logic is configured to assign an equal-sized portion of the specific overall temperature range to each of the plurality of linear equations.

4. The system of claim 1;
wherein the control logic is configured to receive a temperature value representing a current temperature and to select one of the plurality of linear equations according to which one of a plurality of portions of a temperature range includes the temperature value;
wherein the selected one of the plurality of linear equations is associated with the one of the plurality of portions of the temperature range that includes the temperature value; and
wherein the control logic is configured to process the temperature value according to the selected one of the plurality of linear equations to generate the duty cycle value.

5. The system of claim 4, wherein the control logic is configured to store a value indicating a PWM duty cycle range for each of the plurality of linear equations.

6. The system of claim 5, wherein the control logic is programmable to update the value indicating the PWM duty cycle range for each of the plurality of linear equations.

7. The system of claim 4, wherein the control logic is configured to store a value indicating a temperature range for each of the plurality of linear equations.

8. The system of claim 1, wherein dependent on a value of a programmable mode register included in the control logic, the control logic is configured to selectively generate the duty cycle to have the piecewise linear relationship with respect to temperature or to have a linear relationship with respect to temperature.

9. The system of claim 1, wherein the control logic is configured to generate a plurality of PWM signals, wherein the control logic is programmable to generate a duty cycle of each of the plurality of PWM signals to have a respective piecewise linear relationship with respect to a respective temperature input.

10. The system of claim 1, wherein the piecewise linear relationship with respect to temperature is a continuous piecewise linear relationship.

11. A method, comprising:
powering a fan according to a PWM (pulse width modulated) signal;
generating a duty cycle of the PWM signal to have a piecewise linear relationship with respect to temperature, wherein the piecewise linear relationship is defined by respective linear equations, wherein at least two of the respective linear equations have different slopes;

assigning respective portions of a specific overall temperature range to the respective linear equations; and varying the number of the respective linear equations from a default number of respective linear equations, according to the value of the specific overall temperature range and the value of a minimum temperature range per respective linear equation.

12. The method of claim 11, further comprising:
storing a minimum temperature value and the value of the specific overall temperature range.

13. The method of claim 11, wherein the respective portions of the specific overall temperature range is are equally sized.

14. The method of claim 11, wherein said generating comprises:
receiving a temperature value representing a current temperature and selecting one of the respective linear equations corresponding to one of the plurality of portions of the specific overall temperature range that includes the temperature value; and processing the temperature value according to the selected one of the respective linear equations to determine the duty cycle of the PWM signal.

15. The method of claim 14, further comprising storing a value indicating a PWM duty cycle range for each of the respective linear equations.

16. The method of claim 11, further comprising selectively generating the duty cycle of the PWM signal to have a linear relationship with respect to temperature or the piecewise linear relationship with respect to temperature dependent on a value of a programmable mode register.

17. The method of claim 11, further comprising generating a duty cycle of each of a plurality of PWM signals to have a respective piecewise linear relationship with respect to a respective temperature.

18. A system, comprising:
means for powering a fan according to a PWM (pulse width modulated) signal having a duty cycle dependent on a duty cycle value;

means for generating the duty cycle value having a piecewise linear relationship with respect to temperature, wherein the piecewise linear relationship is defined by respective linear equations, wherein at least two of the respective linear equations have different slopes;

means for storing a value indicative of a specific overall temperature range, and a value indicative of a minimum temperature range per respective linear equation;

means for assigning respective portions of the specific overall temperature range to the respective linear equations; and means for varying the number of the respective linear equations from a default number of respective linear equations, according to the value of the specific overall temperature range and the value of the minimum temperature range per respective linear equation.

19. A system, comprising:
a PWM generator configured to generate a PWM (Pulse Width Modulated) signal having a duty cycle dependent on a duty cycle value; and control logic coupled to the PWM generator and configured to generate the duty cycle value to have a piecewise linear relationship with respect to temperature defined by a plurality of linear equations that together approximate a curve;

wherein the control logic is further configured to receive a temperature value representing a present temperature and to select one of the plurality of linear equations according to which one of a plurality of portions of a temperature range includes the temperature value, wherein the selected one of the plurality of linear equations is associated with the one of the plurality of portions of the temperature range that includes the temperature value; and wherein the control logic is further configured to vary the number of the linear equations comprised in the plurality of linear equations from a default number of linear equations, according to the value of the temperature range and the value of a minimum temperature range per linear equation.

20. A system, comprising:
a PWM generator configured to generate a PWM (Pulse Width Modulated) signal having a duty cycle dependent on a duty cycle value; and control logic coupled to the PWM generator and configured to generate the duty cycle value to have a piecewise linear relationship with respect to temperature defined by a plurality of linear equations, wherein a respective slope of each successive one of the plurality of linear equations is higher than a respective slope of any preceding one of the plurality of linear equations;

wherein the control logic is further configured to receive a temperature value representing a present temperature and to select one of the plurality of linear equations according to which one of a plurality of portions of a temperature range includes the temperature value, wherein the selected one of the plurality of linear equations is associated with the one of the plurality of portions of the temperature range that includes the temperature value; and wherein the control logic is further configured to vary the number of the linear equations comprised in the plurality of linear equations from a default number of linear equations, according to the value of the temperature range and the value of a minimum temperature range per linear equation.

21. A method, comprising:
powering a fan according to a PWM (pulse width modulated) signal;

generating a duty cycle of the PWM signal to have a piecewise linear relationship with respect to temperature defined by a plurality of linear equations that together approximate a curve, wherein each of the plurality of linear equations corresponds to one of a plurality of portions of a temperature range, wherein said generating comprises:

receiving a temperature value representing a present temperature, and selecting one of the plurality of linear equations corresponding to one of the plurality of portions of the temperature range that includes the temperature value; and processing the temperature value according to the selected one of the plurality of linear equations to determine the duty cycle of the PWM signal; and varying the number of the linear equations comprised in the plurality of linear equations from a default number of linear equations, according to the value of the temperature range and the value of a minimum temperature range per respective linear equation.

22. A method, comprising:
powering a fan according to a PWM (pulse width modulated) signal;

generating a duty cycle of the PWM signal to have a piecewise linear relationship with respect to temperature defined by a plurality of linear equations associated with respective portions of a temperature range, wherein a slope of one of the plurality of linear equations associated with a lower one of the respective portions of the temperature range is less than a slope of another one of the plurality of linear equations associated with a higher one of the respective portions of the temperature range, wherein said generating comprises:
  receiving a temperature value representing a present temperature, and selecting one of the plurality of linear equations corresponding to one of the respective portions of the temperature range that includes the temperature value; and
  processing the temperature value according to the selected one of the plurality of linear equations to determine the duty cycle of the PWM signal; and
  varying the number of the linear equations comprised in the plurality of linear equations from a default number of linear equations, according to the value of the temperature range and the value of a minimum temperature range per linear equation.

23. A system, comprising:
means for powering a fan according to a PWM (pulse width modulated) signal having a duty cycle dependent on a duty cycle value;
means for generating the duty cycle value having a piecewise linear relationship with respect to temperature defined by a plurality of linear equations that together approximate a curve;
means for receiving a temperature value representing a present temperature;
means for selecting one of the plurality of linear equations according to which one of a plurality of portions of a temperature range includes the temperature value, wherein the selected one of the plurality of linear equations is associated with the one of the plurality of portions of the temperature range that includes the temperature value; and
means for varying the number of the linear equations comprised in the plurality of linear equations from a default number of linear equations, according to the value of the temperature range and the value of a minimum temperature range per linear equation.

24. A system, comprising:
means for powering a fan according to a PWM (pulse width modulated) signal having a duty cycle dependent on a duty cycle value;
means for generating the duty cycle value having a piecewise linear relationship with respect to temperature defined by a plurality of linear equations, wherein a respective slope of each successive one of the plurality of linear equations is higher than a respective slope of any preceding one of the plurality of linear equations;
means for receiving a temperature value representing a present temperature;
means for selecting one of the plurality of linear equations according to which one of a plurality of portions of a temperature range includes the temperature value, wherein the selected one of the plurality of linear equations is associated with the one of the plurality of portions of the temperature range that includes the temperature value; and
means for varying the number of the linear equations comprised in the plurality of linear equations from a default number of linear equations, according to the value of the temperature range and the value of a minimum temperature range per linear equation.

* * * * *